(12) United States Patent
Schaefer et al.

(10) Patent No.: US 11,415,602 B2
(45) Date of Patent: Aug. 16, 2022

(54) METHOD FOR OPERATING AN OSCILLOSCOPE AS WELL AS OSCILLOSCOPE

(71) Applicant: Rohde & Schwarz GmbH & Co. KG, Munich (DE)

(72) Inventors: Andrew Schaefer, Munich (DE); Wolfgang Herbordt, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 399 days.

(21) Appl. No.: 16/208,296

(22) Filed: Dec. 3, 2018

(65) Prior Publication Data

US 2020/0174041 A1    Jun. 4, 2020

(51) Int. Cl.
*G09G 5/00* (2006.01)
*G01R 13/02* (2006.01)
*G06F 3/0488* (2022.01)
*G06F 3/04847* (2022.01)

(52) U.S. Cl.
CPC ..... *G01R 13/0245* (2013.01); *G01R 13/0272* (2013.01); *G06F 3/0488* (2013.01); *G06F 3/04847* (2013.01)

(58) Field of Classification Search
CPC ........... G01R 13/0245; G01R 13/0272; G01R 13/029; G01R 1/025; G06F 3/0488; G06F 3/04847

See application file for complete search history.

(56) References Cited

U.S. PATENT DOCUMENTS

| | | | |
|---|---|---|---|
| 7,155,355 B2 | 12/2006 | Pickerd | |
| 2003/0107573 A1* | 6/2003 | Miller | G01R 13/02 345/440 |
| 2004/0167727 A1 | 8/2004 | Pickerd | |
| 2008/0103710 A1* | 5/2008 | Wegener | G01R 13/029 702/66 |
| 2009/0222771 A1* | 9/2009 | Eibl | G01R 13/029 715/866 |
| 2018/0059143 A1* | 3/2018 | Pupalaikis | G01R 13/208 |

* cited by examiner

*Primary Examiner* — Adam R. Giesy
(74) *Attorney, Agent, or Firm* — Christensen O'Connor Johnson Kindness PLLC

(57) ABSTRACT

A method for operating an oscilloscope is described, wherein a waveform axis scale input value is detected. Further, a record length input value is detected. An oscilloscope operating point is determined relative to at least one predetermined operating mode limit. In addition, a method for operating an oscilloscope as well as an oscilloscope are described.

16 Claims, 8 Drawing Sheets

METHOD FOR OPERATING AN OSCILLOSCOPE AS WELL AS OSCILLOSCOPE

FIELD OF THE DISCLOSURE

Embodiments of the present disclosure relate generally to a method for operating an oscilloscope. Furthermore, embodiments of the present disclosure generally relate to an oscilloscope.

BACKGROUND

In the state of the art, oscilloscopes are known which are used for displaying an input signal on an oscilloscope display, also called screen. Usually, a voltage waveform versus time is displayed on the oscilloscope display wherein the oscilloscope has at least one input, for instance an input jack, for connecting a device emitting a signal to be displayed on the oscilloscope display.

Furthermore, the oscilloscope has at least one operation member to control how the signal is displayed on the oscilloscope display such as a dial, a knob, a button and/or any other suitable operation member to be operated by the operator. Typically, an operator of the oscilloscope is enabled to set a horizontal scale as well as a record length using the respective operation member(s), also called standard input mechanism(s).

Depending on the respective settings done by the operator via the operation member(s), certain oscilloscope operating points are not possible or rather not allowed due to various constraints assigned to the oscilloscope with regards to the settings. So far, the operator simply gets a message indicating that the respective limits have been reached when an operating point boundary is reached, also called operating mode limit. In other words, the message is output once an operating point is set that is beyond an allowable range of operating points.

However, a deep understanding of the oscilloscope is required to understand why the respective limit has been reached or rather why the operating point set is beyond the allowable range of operating points. This might be frustrating or rather confusing to the operator.

Accordingly, there is a need for a method as well as an oscilloscope enabling an intuitive and easy control of the oscilloscope.

SUMMARY

Embodiments of the present disclosure provide, for example, a method for operating an oscilloscope. The method comprises the steps:

detecting a waveform axis scale input value;

detecting a record length input value; and determining an oscilloscope operating point relative to at least one predetermined operating mode limit.

Further, embodiments of the present disclosure provide, for example, a method for operating an oscilloscope, with the following steps:

receiving an input of an operator with regard to at least one of a waveform axis scale input value and a record length input value;

processing the input of the operator to determine an allowable operating range based upon the input of the operator; and displaying the allowable operating range determined on an oscilloscope display.

Furthermore, embodiments of the present disclosure provide an oscilloscope with a housing, a processor housed in the housing and an oscilloscope display assigned to the housing. The processor is connected with the oscilloscope display. Further, the processor in some embodiments is configured to process an operator input with regard to at least one of a waveform axis scale input value and a record length input value. The processor in these or other embodiment is further configured to determine an oscilloscope operating point relative to at least one predetermined operating mode limit.

Accordingly, input(s) or rather input value(s) are received and detected by the oscilloscope, in particular the embedded processor. The respective input(s) or rather input value(s) may be set by the operator previously. The oscilloscope, for example, its processor, processes the data detected, namely the respective input(s) or rather input value(s), to determine at least one oscilloscope operating point. Moreover, the processor may take other settings of the oscilloscope into account to determine the allowable operating range comprising several allowable oscilloscope operating points. Thus, the oscilloscope itself may determine whether the current oscilloscope operating point or rather a future one, namely after a certain adaption or rather change of an input (value), is an allowable one or not. The oscilloscope operating point may be determined relative to at least one predetermined operating mode limit that corresponds an operating point boundary.

In some embodiments, the oscilloscope, for example, the processor, is also configured to determine an invalid oscilloscope operating point, namely an operating point located outside the allowable operating range.

In other words, the oscilloscope is generally configured to determine an oscilloscope operating point wherein it is verified whether or not the oscilloscope operating point determined corresponds to an allowable one, also called valid one, or rather an invalid one.

The allowable operating range comprises several (valid or rather allowable) oscilloscope operating points. The allowable operating range is assigned to the at least one predetermined operating mode limit. In other words, the at least one predetermined operating mode limit is assigned to the allowable operating range. Thus, the at least one predetermined operating mode limit may inter alia define the at least one boundary, in particular the boundaries, between valid oscilloscope operating points and invalid ones. Accordingly, the at least one predetermined operating mode limit is assigned to the allowable operating range as well as the non-allowable operating range.

The oscilloscope may be operated via a user interface displayed on the oscilloscope display.

According to an aspect, the waveform axis scale input value is a horizontal scale input value. The horizontal scale input value may relate to a scaling of the time domain of the signal to be displayed by the oscilloscope, in particular on the oscilloscope display. In fact, the horizontal scale input value may indicate the duration of the signal to be displayed in one division. Hence, the amount of time displayed on the oscilloscope display can be set indirectly by setting the respective horizontal scale input value as the number of divisions is typically fixed or at least pre-set.

In general, an oscilloscope display is assigned to a two dimensional grid having two axes, namely a horizontal one and a vertical one. For instance, the two dimensional grid may be a 10×10 grid. Thus, 10 (major) divisions in vertical direction and 10 (major) divisions in horizontal direction are provided. Furthermore, each (major) division may be broken up into minor divisions, for instance 5 minor divisions.

By setting a waveform axis scale input value, the vertical scale or rather the horizontal scale may be set in a certain manner. Typically, the horizontal axis represents time whereas the vertical axis represents voltage.

If, for example, the oscilloscope is set to 1 volt/major vertical division (vertical scale input value) and 0.5 seconds/major horizontal division (horizontal scale input value), then a point situated at the 2-dimensional coordinates of 2 major vertical divisions plus 2 minor vertical division and at 3 major horizontal divisions plus 4 minor horizontal divisions would represent a 2.4 volts at a position of time of 1.9 seconds from the start of the waveform.

According to another aspect, at least one of the waveform axis scale input value and the record length input value is set manually by an operator of the oscilloscope. The operator is enabled to set the respective value(s) in order to change the respective oscilloscope operating point, namely the settings of the oscilloscope display. For instance, the oscilloscope operating point determined may relate to a future one due to a change of a respective setting of the oscilloscope, for instance changing the waveform axis scale input value and/or the record length input value. Therefore, the oscilloscope, for example, the processor, may determine the (future) oscilloscope operating point assigned to the newly set waveform axis scale input value and/or the newly set record length input value.

For instance, at least one of the waveform axis scale input value and the record length input value is set by at least one of using a knob, using a dial, using a button, using a remote control device and touching a touch-sensitive display. Hence, a mechanical operation member such as a knob, a dial or a (navigation) button may be used for setting the respective value(s).

Alternatively or additionally, a remote control device may be used by the operator via which the operator is enabled to interact with the oscilloscope in a wireless manner. For this purpose, the oscilloscope may have at least one signal receiver, for example, a signal transceiver. The remote control device may also be wired to the oscilloscope, for instance a mouse or any other device formed separately with respect to the oscilloscope.

Furthermore, the oscilloscope display may be a touch-sensitive display so that the operator can directly interact with the oscilloscope display to adapt or change certain settings of the oscilloscope, for instance the waveform axis scale input value and/or the record length input value. The user interface may directly display how a change or rather adaption of a certain setting of the oscilloscope, for example the waveform axis scale input value and/or the record length input value, affect the respective oscilloscope operating point, for instance a future one.

Moreover, the operator may be enabled to directly change the oscilloscope operating point by touching the touch-sensitive oscilloscope display in an appropriate manner. In some embodiments, the allowable operating range, namely the area of valid oscilloscope operating points, is displayed on the oscilloscope display. Thus, the operator is enabled to directly select a valid oscilloscope operating point.

Furthermore, the determination of the oscilloscope operating point may be based upon at least one of the waveform axis scale input value and the record length input value. The respective value(s) set by the operator are taken into account for determining the oscilloscope operating point. In other words, the settings of the operator affect the oscilloscope operating point. Thus, an adaption or rather change of the input value(s) may be visualized instantaneously while a respective oscilloscope operating point, in particular a future one, is determined based upon the respective value(s) set by the operator.

The operating mode limit may be predetermined based upon at least one of an original analog to digital converter sample rate, a rate change due to decimation or interpolation and a number of divisions. The boundaries of the allowable operating points depend on the respective settings of the oscilloscope.

Generally, the waveform axis scale input value, namely the horizontal scale input value H, the (at least pre-set) number of divisions $N_{div}$ and the amount of time displayed on the oscilloscope display $t_{scr}$ relate to each other as follows:

$HN_{div}=t_{scr}$, wherein this equation can be defined by:

$HN_{div}=T_{eff}N_{rl}$, with $T_{eff}$ corresponding to the effective sample period and $N_{rl}$ corresponding to the record length.

The record length comprises the acquisition length, namely the number of acquired samples, including a possible interpolation.

The effective sample rate $f_{eff}$ corresponds to the reciprocal of the effective sample period $T_{eff}$, wherein the effective sample rate $f_{eff}$ can be written as follows:

$$f_{eff} = \frac{f_0}{R},$$

with $f_0$ is the original sample rate from an analog to digital converter (ADC) and R being the rate change due to decimation or interpolation of the sampled data.

Accordingly, the parameters on which the operating mode limit is based depend on the input values, namely by:

$$R = \frac{HN_{div}f_0}{N_{rl}}$$

Another aspect provides that at least one of the oscilloscope operating point and the operating mode limit is processed by a graphic processor for displaying at an oscilloscope display. The processor of the oscilloscope may be a graphic processor configured to generate a graphical user interface (GUI) to be output on the oscilloscope display wherein the graphical user interface illustrates the oscilloscope operating point determined and/or the operating mode limit determined. As already mentioned, the operating mode limit may be assigned to the allowable operating range. Moreover, the operating mode limit may also be assigned to the non-allowable operating range. Accordingly, the operator of the oscilloscope directly gathers data concerning the boundary limits of the oscilloscope with regard to the current settings.

In embodiments of the present disclosure, an area may be displayed on the graphical user interface (GUI), which illustrates the operating mode limit or rather the allowable operating range (and/or the non-allowable operating range), so that the operator can directly grasp which oscilloscope operating points relate to which range, namely the valid one or rather the invalid one.

In some embodiments, the operating mode limit comprises an interpolation mode versus decimation mode limit. The oscilloscope operating point may be assigned to the interpolation mode of the oscilloscope or rather the decimation mode of the oscilloscope wherein the respective assignment depends on the input value(s) set. On the graphical user interface, an area assigned to the interpolation mode as well as an area assigned to the decimation mode may be illustrated wherein both modes comprise valid oscilloscope operating points. Hence, the operator is enabled to verify whether the actual oscilloscope operating point is assigned to the interpolation mode or rather the decimation mode.

Furthermore, the operator may be enabled to change or adapt a certain setting, for example the waveform axis scale input value and/or the record length input value, to move the (future) oscilloscope operating point within the respective mode or rather towards another mode. Hence, the operator may select another (valid) oscilloscope operating point, for instance by simply interacting with the touch-sensitive oscilloscope display.

The operating mode limit may comprise a display column value limit based upon a number of columns of the oscilloscope display. The display column value corresponds to the resolution of the oscilloscope display as well as its size. Each display can be defined by rows and columns each made of pixels wherein the respective resolution defines the number of pixels per inch.

If the display resolution is 72 pixels per inch (PPI) a display having a width of 10" requires 720 pixels to support the width. If the display height is 6" 432 pixels support this height. Accordingly, the full display has 311,040 pixels arranged in 432 rows and 720 columns. If the width is increased while retaining the same resolution, pixels have to be added to support the added width. For instance, changing the width from 10" to 12" yields additional 144 (72×2) columns of pixels each with the same number of rows (432) or 62,208 additional pixels in total.

Hence, the display column value limit may indicate the maximum as well as the minimum number of columns of the oscilloscope display which may be used for displaying purposes. In other words, the operating mode limit may be assigned to the display window provided by the oscilloscope display and/or the respective operating mode limit may depend on the display itself. The display column value may be restricted by a memory of the oscilloscope used for acquiring data samples. In some embodiments, the data to be displayed is restricted by the data acquired.

Another aspect provides that the operating mode limit comprises a channel operating mode limit based upon a number of active oscilloscope channels. The number of active oscilloscope channels may vary the boundaries of the (valid) oscilloscope operating point(s), namely the allowable operating range. Possible extensions to the current operating range, namely the allowable operating range under the current settings, may be indicated by the graphical user interface. Hence, the operator can easily identify which system parameter affects the allowable operating range in which manner. For instance, the maximum number of samples (per channel) may be illustrated depending on the number of active channels and/or window width.

Generally, the window width relates to the width of the window used for displaying the respective information. The operator may select that the window is smaller than the overall size of the oscilloscope display so that different windows can be displayed simultaneously.

Furthermore, a (maximum) sample rate as well as a (maximum) memory depth, in particular per channel, may be displayed in dependency of the number of active oscilloscope channels. In addition, effects related to changes of the number of the active oscilloscope channels may also be displayed. Thus, the operator easily recognizes which setting influences which parameter of the oscilloscope. For instance, reducing the number of active oscilloscope channels yields a higher (maximum) sample rate as well as a (maximum) memory depth.

Moreover, the operating mode limit may comprise a decode mode limit based upon available processing power for bus decoding a measured bus signal. For instance, oscillator operating points that do not work under certain settings are displayed differently. The (actual or rather future) oscillator operating point determined may be displayed in a different manner which depends on whether or not the respective oscillator operating point is assigned to the allowable or the non-allowable operating range, namely the non-working one.

The non-working area may be assigned to the interpolation mode or rather the decimation mode of the oscilloscope provided that this operating mode limit is also enabled. Therefore, the operator gathers the information that an area of oscilloscope operating points is assigned to a certain mode which is not-working in the respective application, namely for decoding a certain type of serial bus.

Furthermore, the operating mode limit may comprise a spectrum analysis limit based upon at least one of a span and a resolution bandwidth. In addition, Fourier transforms or rather spectral analysis settings may be taken into account for determining the operating mode limit such as the span and the resolution bandwidth. The respective span and/or resolution bandwidth may be displayed so that the operator can set the oscilloscope operating point in an appropriate manner while taking the span and/or resolution bandwidth displayed into account.

In other words, setting the oscilloscope with respect to a certain application is simplified, for instance decoding a certain type of serial bus, a spectral analysis and/or a Fourier transform.

According to another aspect, the operating mode limit comprises at least one of a zoom window limit and a visualization limit based upon a zoom factor. The respective oscilloscope operating point may be assigned to a zoom factor, for example a two-zoom or rather a maximum zoom assigned to the visualization limit. The respective allowable operating range is displayed wherein the respective valid zoom factor(s) is/are indicated on the display. Hence, the operator may easily select the corresponding oscilloscope operating point yielding an allowable zoom, for example an allowable two-zoom or rather an allowable maximum zoom.

In some embodiments, the operating mode limit comprises a zero-blind-time limit based upon operating points being zero-blind-time capable. Hence, an area comprising oscilloscope operating points being zero-blind-time capable are highlighted in the user interface. Accordingly, the operator can easily select a certain oscilloscope operating point assigned to this area in order to select a zero-blind-time capable oscilloscope operating point. The zero-blind-time capable oscilloscope operating points relate to oscilloscope operating points without any blind time, namely the time, the oscilloscope is blind to the measurement signal. Hence, these blind times do not occur in the respective oscilloscope operating points that are zero-blind-time capable.

Generally, the allowable as well as the non-allowable, namely the non-working, operating ranges may be displayed differently so as to indicate which oscilloscope operating point works or not.

Another aspect provides that a preview is displayed next to the oscilloscope operating point determined to provide an instantaneous preview based on the respective oscilloscope operating point. Therefore, a preview of the signal to be displayed with respect to the adapted or changed settings may be provided. Thus, the operator directly obtains a graphical feedback how the signal to be displayed will be displayed (in a larger window on the oscilloscope display) in case of selecting the respective oscilloscope operating point. The preview may be used for illustrating changes in speed, decodability (the ability of decoding) of a bus signal and/or effects of interpolation or rather decimation.

Moreover, a recommendation may be displayed how to adapt at least one of a setting of the oscilloscope, the waveform axis scale input value and the record length input value. Therefore, the operator may be informed how to adapt the settings of the oscilloscope, for example the waveform axis scale input value and/or the record length input value, in order to obtain a valid oscilloscope operating point, namely an oscilloscope operating point within the allowable operating range. Hence, some kind of guidance is provided to the operator.

In addition to the recommendation displayed, an achievable result may be indicated when the recommendation displayed is followed by the operator. Hence, the recommended setting as well as the effect assigned thereto is illustrated.

The recommendation may relate to a bandwidth which affects a gain in resolution in a high definition mode.

Moreover, recommended oscilloscope operating points may be displayed, in particular for time-based measurement with a certain resolution, for instance up to 1 µs.

The allowable operating range displayed may relate to at least one of a range of allowed settings and allowable oscilloscope operating points. An area may be output indicating the range of allowable oscilloscope operating points. In fact, this area may be assigned to the range of allowed settings of the oscilloscope. Thus, the operator can change or rather adapt the settings of the oscilloscope, for example the waveform axis scale input value and/or the record length input value, so that another oscilloscope operating point is set. The respective oscilloscope operating point can be determined based upon the respective value(s) set by the operator. Since the (future) oscilloscope operating point and the allowable range are displayed, the operator is enabled to directly notice whether or not the change(s) or rather adaption(s) yield an allowable oscilloscope operating point or not.

Another aspect of the present disclosure provides that the allowable operating range is displayed on an interactive display enabling the operator to adapt its input instantaneously. Accordingly, the operator may adapt the respective input on the oscilloscope display, for example select another oscilloscope operating point, so that the functionality is improved as the operator may directly tap on a certain point in the allowable operating range comprising all allowable oscilloscope operating points. This ensures that the selected oscilloscope operating point is an allowable one. By selecting a certain oscilloscope operating point, the respective settings of the oscilloscope are selected (indirectly), namely the waveform axis scale input value and/or the record length input value.

The processor may be configured to determine the oscilloscope operating point based upon at least one of the waveform axis scale input value and the record length input value. The processor may be a graphic processor or include graphics processing functionality that generates a graphical user interface to be displayed on the oscilloscope display.

Generally, the respective graphical user interface may be displayed on the oscilloscope display additionally to a main portion, also called main window, of the oscilloscope display that is used for displaying the measured signal. The main window may illustrate the measured signal with respect to the current oscilloscope operating point.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
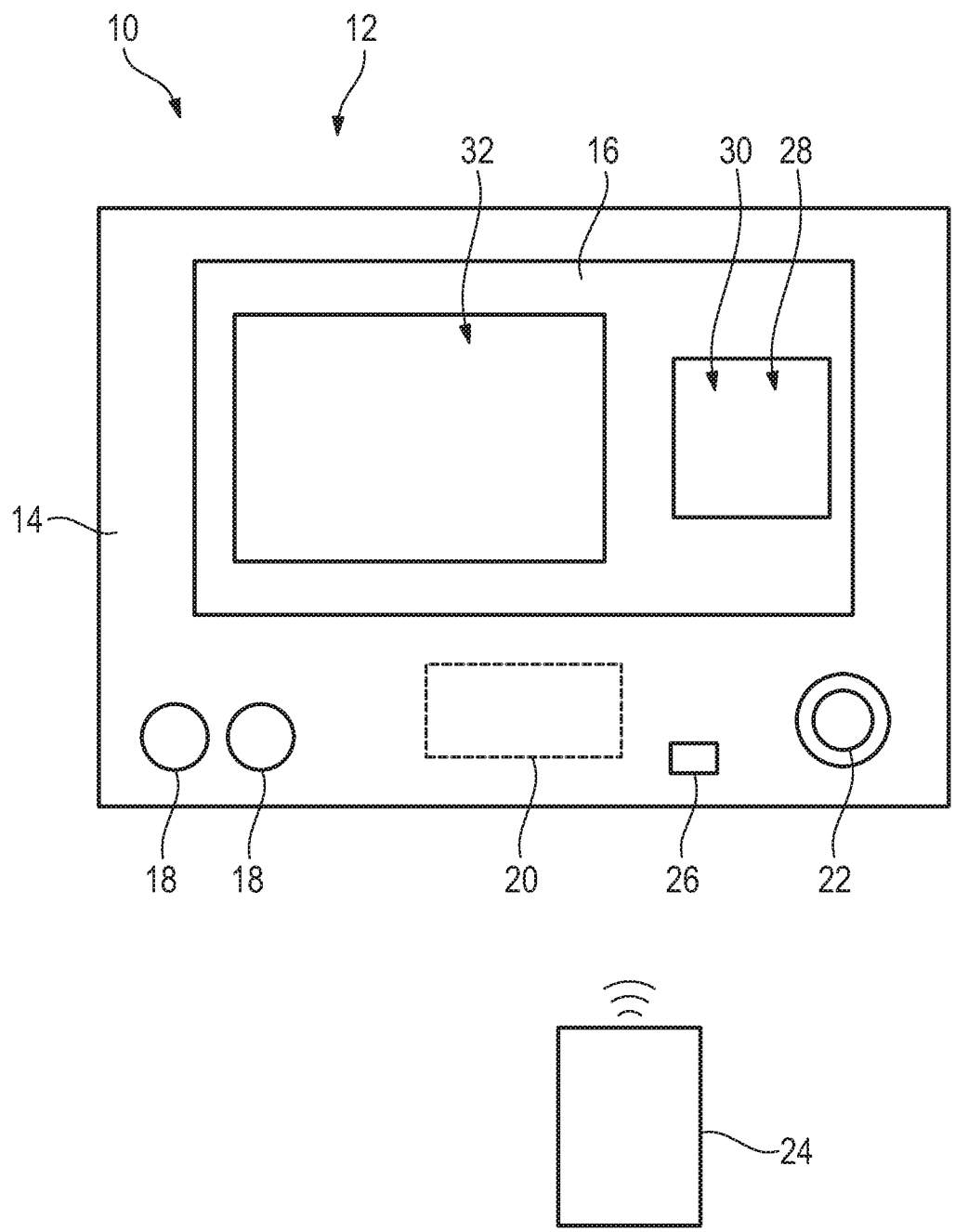
FIG. 1 schematically shows a representative oscilloscope according to the present disclosure.

In FIG. 1, a measurement system 10 is schematically shown that comprises an oscilloscope 12 with a housing 14 and a display 16 assigned to the housing 14. The oscilloscope 12 has at least one input 18 configured for receiving an input signal to be displayed on the oscilloscope display 16. The input signal is also called a measured signal. In some embodiments, the input 18 may be coupled with a probe used for probing a device so as to obtain the input signal to be processed by the oscilloscope 12.

The input signal received via the input 18 is processed by an internal processor 20 that is located within the housing 14. The processor 20 may be a graphic processor or include graphics processing capabilities, as will be discussed later in more detail. The processor 20 may process the input signal received via the input 18 based upon settings set by an operator of the oscilloscope 12 via at least one operation member 22, for instance.

In the shown embodiment, the operation member 22 is established by a knob, a dial or a button, which is extending from the housing 14 such that the operator can easily interact with the operation member 22.

Hence, the operator of the oscilloscope 12 is enabled to manually set a certain input value of the oscilloscope 12 that influence the graphic illustration on the oscilloscope display 16. For instance, the input value may be a waveform axis scale input value, namely a horizontal scale input value, and/or a record length input value of the oscilloscope 12. The respective input values may be set via the operation member 22.

The oscilloscope display 16 may be a touch-sensitive display so that the operator of the oscilloscope 12 is also enabled to set the respective input value by interacting with the touch-sensitive display, namely the oscilloscope display 16.

Alternatively or additionally, a remote control device 24 may be used that interacts with the oscilloscope 12. The remote controlled device 24 may be part of the system 10 so that the oscilloscope 12 is enabled to be controlled remotely. For this purpose, the oscilloscope 12 may comprise at least a signal receiver 26. The receiver may be established by a transceiver so that the oscilloscope 12 is also enabled to transmit signals wirelessly to the remote control device 24 so that certain information may be output or rather displayed on the remote control device 24.

In general, the processor 20 is enabled to determine an oscilloscope operating point based upon the waveform axis scale input value and/or the record length input value, namely the input values set by the operator of the oscilloscope 12.

The respective oscilloscope operating point is determined relative to at least one predetermined operating mode limit. The predetermined operating mode limit may be based upon at least one of an original analog-to-digital converter sampling rate, namely the sample rate of the ADC implemented within the oscilloscope 12, a rate change due to decimation or interpolation done by the oscilloscope 12 and/or a number of divisions.

In other words, the operating mode limit corresponds to boundaries of allowable oscilloscope operating points. The parameters on which the predetermined operating mode limit is based are related to the input values upon which the respective oscilloscope operating point is based, namely by:

$$R = \frac{H N_{div} f_0}{N_{rl}},$$

with $f_0$ being the original sample rate from an analog to digital converter (ADC) and R being the rate change due to decimation or interpolation of the sampled data. Furthermore, $N_{div}$ corresponds to the (at least pre-set) number of divisions whereas H represents the horizontal scale input value and $N_{rl}$ represents the record length input value.

Accordingly, the processor 20 is enabled to determine whether the input values, namely the horizontal scale input value H and the record length input value $N_{rl}$ yield an allowable oscilloscope operating point with respect to the operating mode limit defined by the original sample rate from an analog to digital converter (ADC) $f_0$, the rate change due to decimation or interpolation of the sampled data R as well as the (at least pre-set) number of divisions $N_{div}$.

As discussed above, the processor 20, namely the graphic processor, is configured to process the oscilloscope operating point and/or the operating mode limit to generate a graphical user interface (GUI) to be displayed on the oscilloscope display 16. Thus, the respective content is displayed on the oscilloscope display 16.

As the oscilloscope display 16 may be a touch-sensitive display, the operator may directly interact with the graphical user interface displayed on the oscilloscope display 16 for setting the respective input value(s) in an appropriate manner. In other words, the operator is enabled to set the waveform axis scale input value and/or the record length input value by interacting with the graphical user interface displayed by the touch-sensitive oscilloscope display 16.

In some embodiments, the operator may directly select a certain oscilloscope operating point by interacting with the touch-sensitive oscilloscope display 16 since the operating mode limit, namely the respective operating point boundary, is displayed so that the allowable operating range is illustrated.

Accordingly, the oscilloscope 12 is configured to receive an input signal via the at least one input 18 for being displayed on the oscilloscope display 16.

Furthermore, the oscilloscope 12, for example its processor 20, is configured to receive an input of the operator, for instance via the operation member 22, the remote control device 24, the touch-sensitive oscilloscope display 16 directly, or via other user interfaces, wherein the input relates to at least one of a waveform axis scale input value and a record length input value.

The input signal as well as the input (value) of the operator is processed by the processor 20 to determine at least the allowable operating range, namely the area of valid oscilloscope operating points. The allowable operating range determined is displayed via the oscilloscope display 16 so that the operator directly understands how to change a certain setting of the oscilloscope 12 to adapt the respective oscilloscope operation point.

Accordingly, the allowable operating range displayed relates to at least one of a range of allowed settings of the oscilloscope 12 as well as allowable oscilloscope operating points.

Since the allowable operating range is displayed on the interactive oscilloscope display 16, namely the touch-sensitive one, the operator is enabled to adapt its input instantaneously. Thus, the operator may directly receive a feedback with regard to the setting done.

In general, the operator may view the allowed range while making changes or rather adaptions of the respective settings, namely the input values. Alternatively or additionally, the operator may interact with the graphical user interface to make the desired changes or rather adaptions.

In FIGS. 2 to 14, different scenarios are shown or rather different graphical user interfaces 28. Generally, the graphical user interface 28 may be displayed as an aided section or rather secondary window 30 on the oscilloscope display 16 in addition to a main section or rather a main window 32 in which the signal measured is illustrated with respect to the current oscilloscope operating point. The current oscilloscope operating point may be illustrated in the secondary window.

As shown in the following figures, the operator is generally enabled to select a certain operating point in a graphical manner while touching the touch-sensitive oscilloscope display 16 or operating the operation member 22. The graphical user interface 28 displayed on the oscilloscope display 16 graphically outputs where the current operating point is. In addition, an allowable range or rather an operating mode limit is illustrated so that the operator is informed whether or not the current oscilloscope operating point is within the allowable range or out of the allowable range.

Thus, the operator is enabled to obtain a direct feedback whether or not his actual changes or rather adaptions yield an operating point being out of the allowable range. Furthermore, recommendations, achievable parameters or rather effects of different settings may be displayed on the graphical user interface 28 to provide an intuitive understanding of the operation of the oscilloscope 12 as well as its control. The graphical user interface 28 is capable of displaying an oscilloscope operating point, namely a current one or rather a future one based on changes or rather adaptions made by the operator. Thus, a graphic guiding to the operator is provided.

Figure 2:
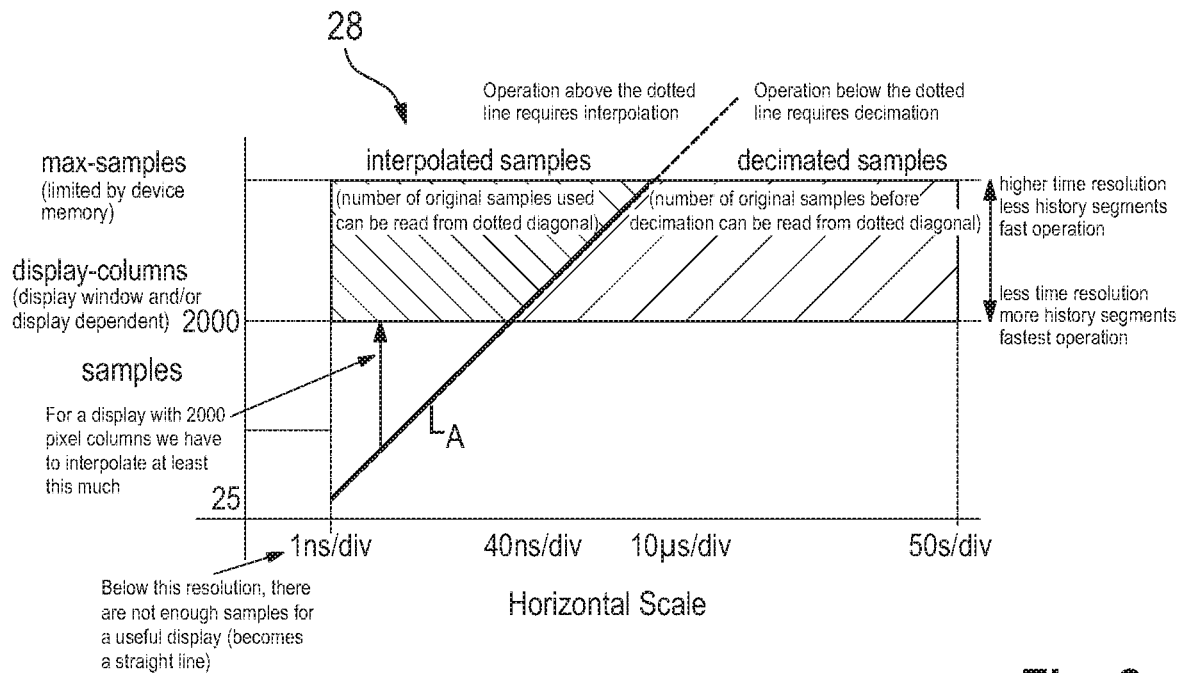
FIG. 2 shows an oscilloscope user interface in a first state according to the present disclosure.

In FIG. 2, the operating mode limit comprises an interpolation mode versus decimation mode limit since the graphical user interface 28 illustrates an area assigned to the interpolation mode as well as an area assigned to the decimation mode. In addition, boundaries of the respective areas are indicated so that an allowable operating range for both modes is shown. Moreover, the graphical user interface 28 shown in FIG. 2 illustrates a display column value limit. The allowable operating range is limited by a memory of the oscilloscope 12 as well as the window size set or rather the display 16.

In general, the graphical user interface 28 as shown provides an overview of the allowed settings wherein the numbers are just to give a better feeling for the example and should not restrict the range.

The operator may select an oscilloscope operating point in a graphical manner, for instance by touching the touch-sensitive oscilloscope display 16, using the remote control device 24 or rather any other operation member 22. In addition, the operator is informed about the current oscilloscope operating point with respect to the at least one predetermined operating mode limit, namely the display column value limit and the interpolation mode versus decimation mode limit.

Figure 3:
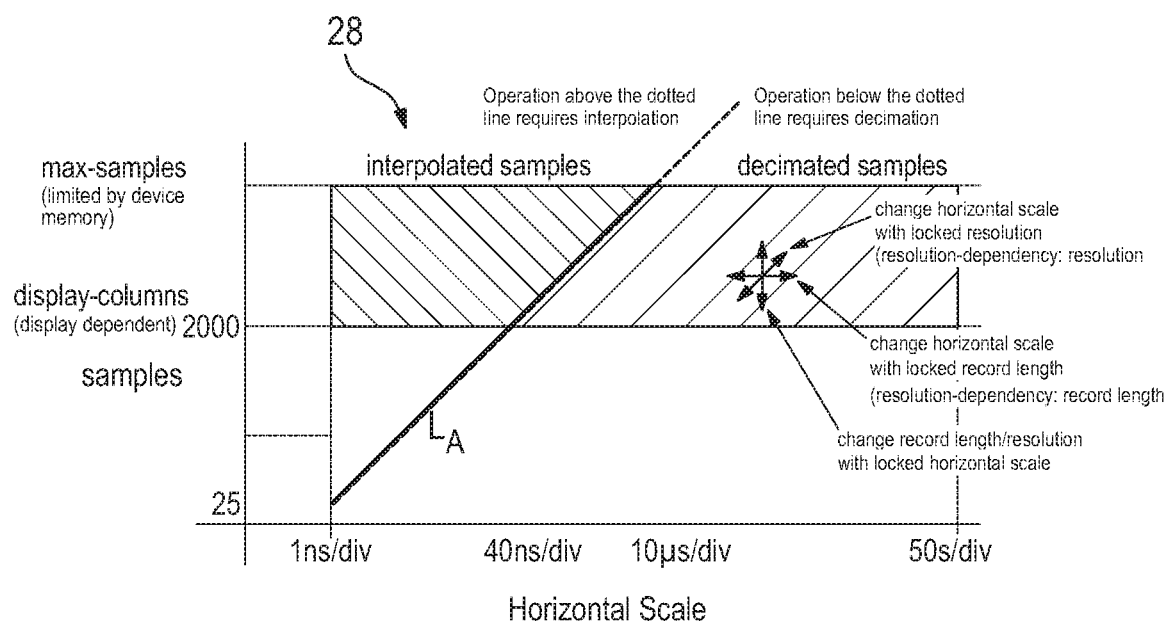
FIG. 3 shows an oscilloscope user interface in a second state according to the present disclosure.

In FIG. 3, the current oscilloscope operating point is additionally illustrated. Furthermore, the possible directions in which the setting could be changed are also illustrated as well as the effects related to these changes.

Figure 4:
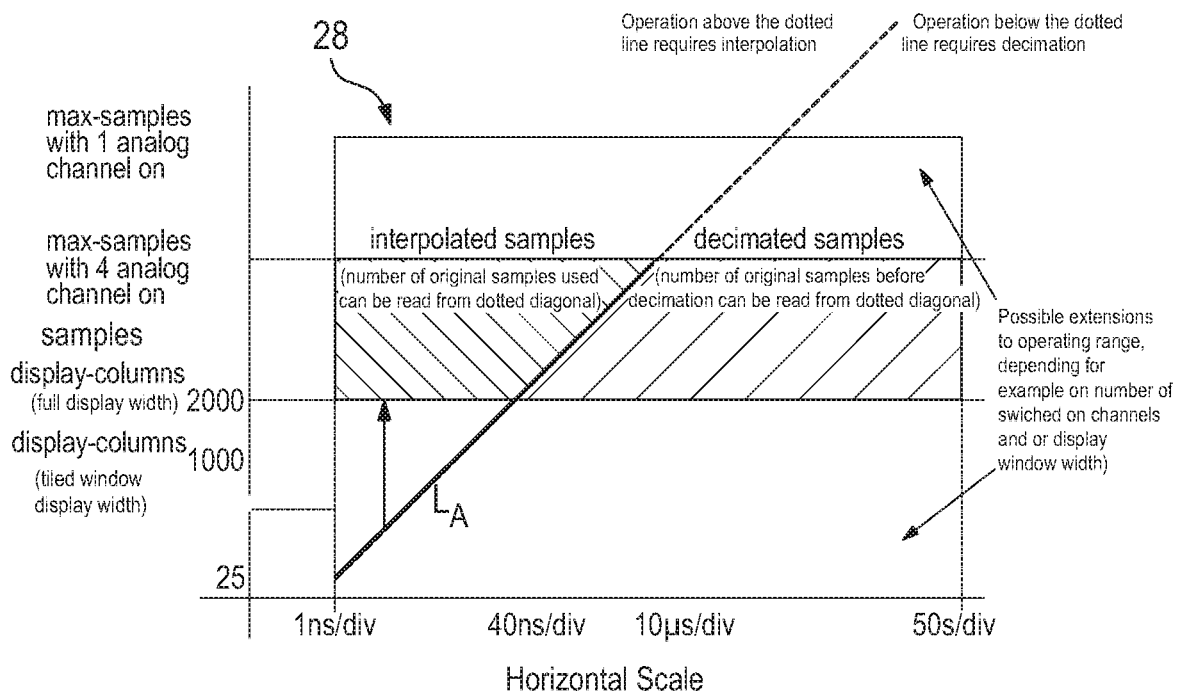
FIG. 4 shows an oscilloscope user interface in a third state according to the present disclosure.

In FIG. 4, the graphical user interface 28 illustrates a channel operating mode limit and how the respective system parameters affect the range of allowed settings, namely the predetermined operating mode limit or rather the allowable operating range.

In embodiments of the present disclosure, it is shown that the operating range, namely the allowable one, can be extended by changing the number of switched on channels, namely the active channels, and/or the window width of the main window 32 which illustrates the measured signal with respect to the oscilloscope operating point.

Figure 5:
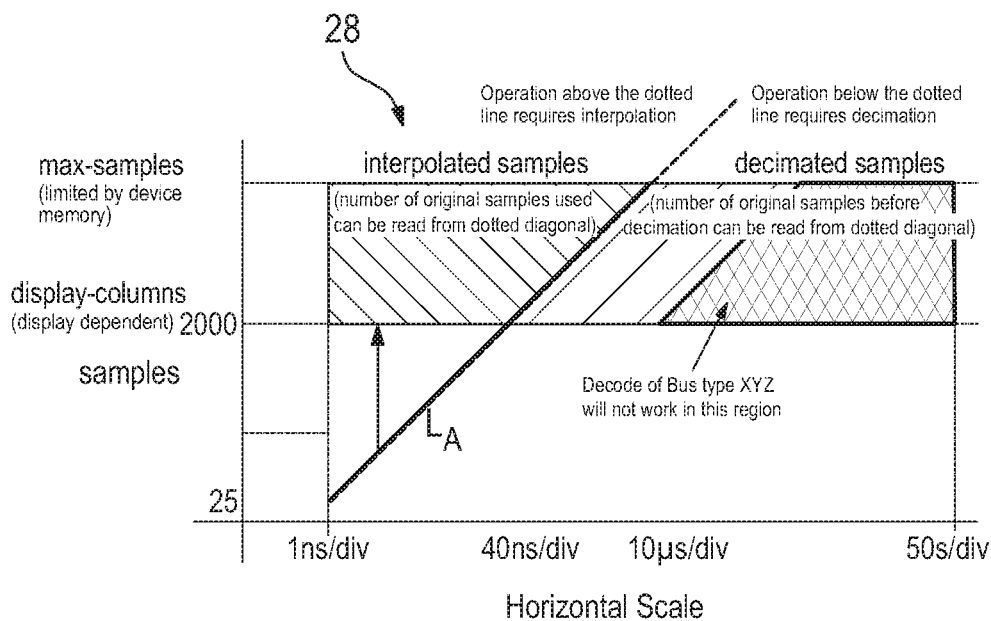
FIG. 5 shows an oscilloscope user interface in a fourth state according to the present disclosure.

In FIG. 5, the graphical user interface 28 illustrates a decode mode limit. Hence, a certain application is shown. In the graphical user interface 28, it is illustrated that a certain bus type, namely bus type XYZ, cannot be decoded in a certain area assigned to the decimation mode. The respective non-working area is highlighted to inform the operator appropriately. In other words, the operator is informed which oscilloscope operating points are suited to certain applications, namely the decoding of a certain type of serial bus.

Figure 6:
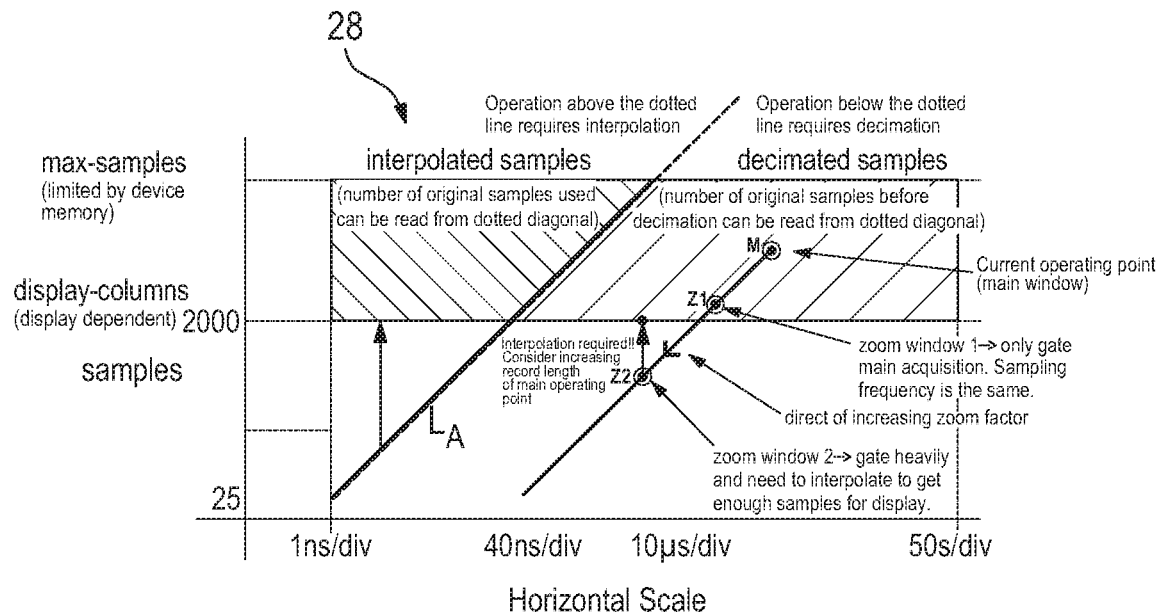
FIG. 6 shows an oscilloscope user interface in a fifth state according to the present disclosure.
Figure 7:
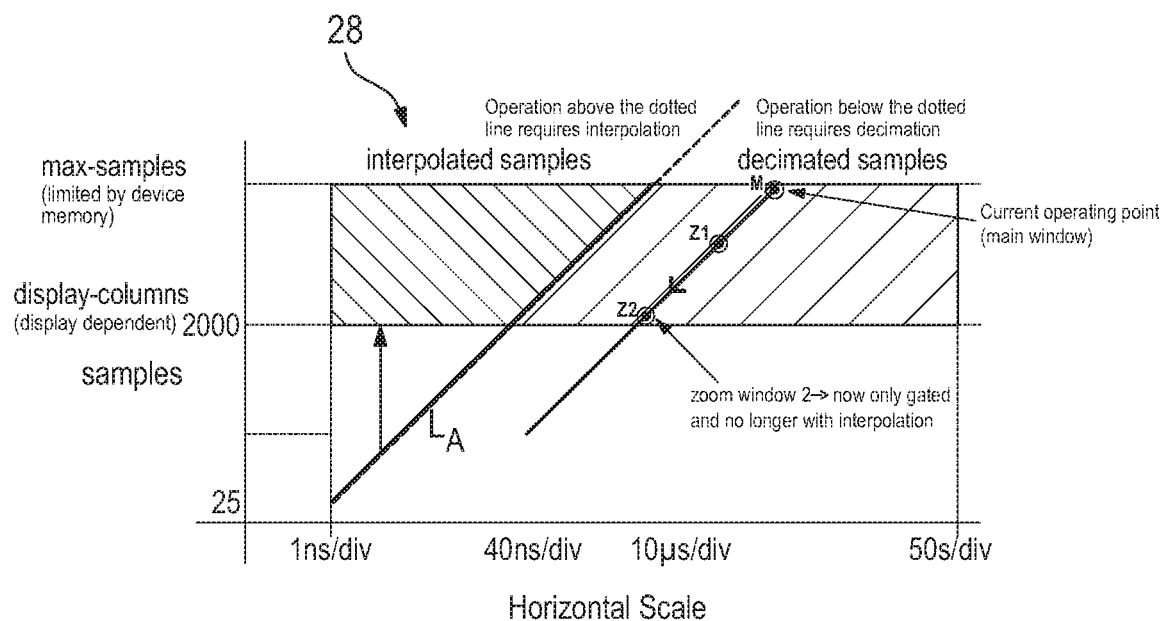
FIG. 7 shows an oscilloscope user interface in a sixth state according to the present disclosure.

In FIGS. 6 and 7, the graphical user interface 28 illustrates a zoom window limit, for example a two zoom (2 zoom). In some embodiments, two different zoom factors Z1, Z2 assigned to the two zoom function are illustrated that have been derived from the main acquisition, namely the current oscilloscope operating point M.

As shown in FIG. 6, interpolation is required for the second zoom factor Z2 which is not desired. In contrast thereto, the first zoom Z1 or rather the respective first zoom window only requires gating whereas the second zoom window requires gating and interpolation.

Therefore, the graphical user interface 28 outputs a recommendation according to which increasing the record length, namely the record length input value, shall be considered.

Provided that the recommendation is followed as shown in FIG. 7, both zoom factors may be assigned to the allowable operating range. In some embodiments, the operator has increased the record length while staying at the same horizontal resolution, namely the waveform axis scale input value.

Figure 8:
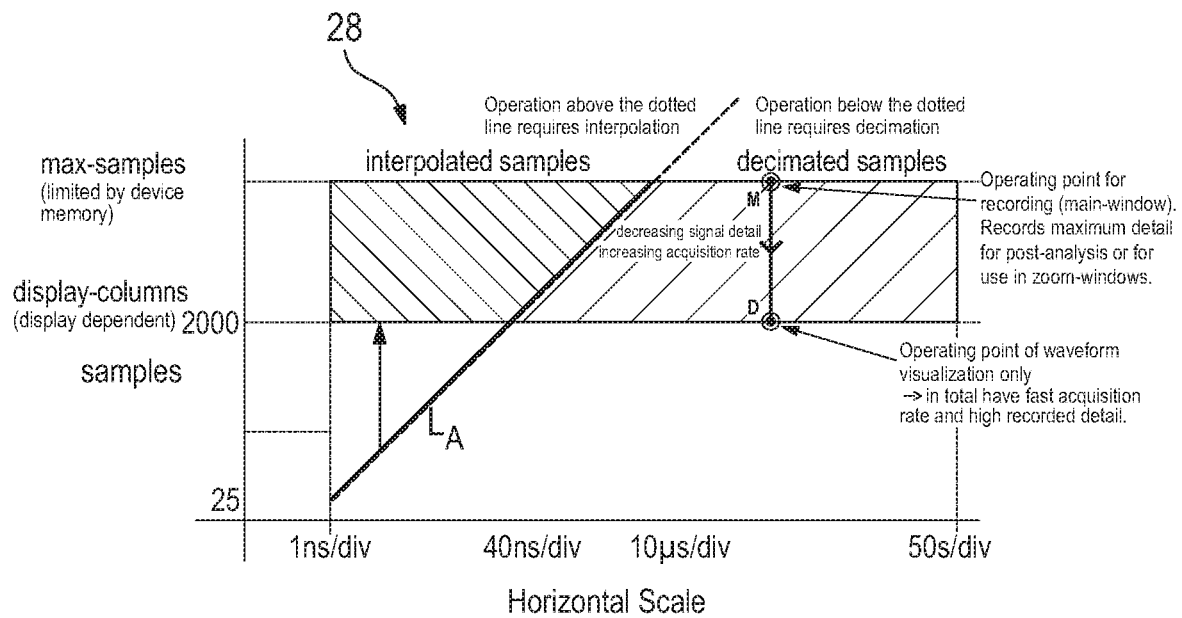
FIG. 8 shows an oscilloscope user interface in a seventh state according to the present disclosure.

In FIG. 8, the graphical user interface 28 illustrates a visualization limit, for example a maximum zoom, also called dual-decimation. The recording oscilloscope operating point M records full signal detail and allows accurate zooming capabilities for very high zoom factors. The visualization oscilloscope operating point D has a high decimation factor but allows a faster display of the recorded waveform.

This visualization may be combined with the serial bus analysis. Thus, a visualization operating point may be chosen such that the sample rate on this path is high enough for serial bus decoding.

Figure 9:
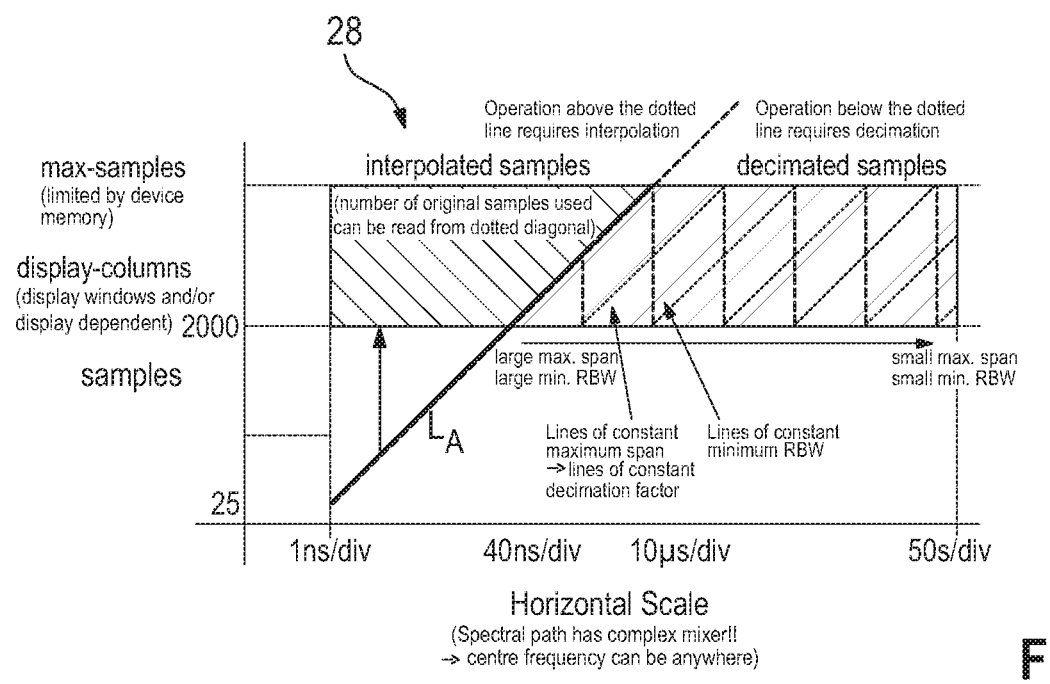
FIG. 9 shows an oscilloscope user interface in an eighth state according to the present disclosure.

In FIG. 9, the graphical user interface 28 illustrates a spectrum analysis limit. In the graphical user interface 28, lines of constant maximum span assigned to lines of constant decimation factor as well as lines of constant minimum resolution bandwidth are shown so that the operator is enabled to select the respective oscilloscope operating points easily.

Figure 10:
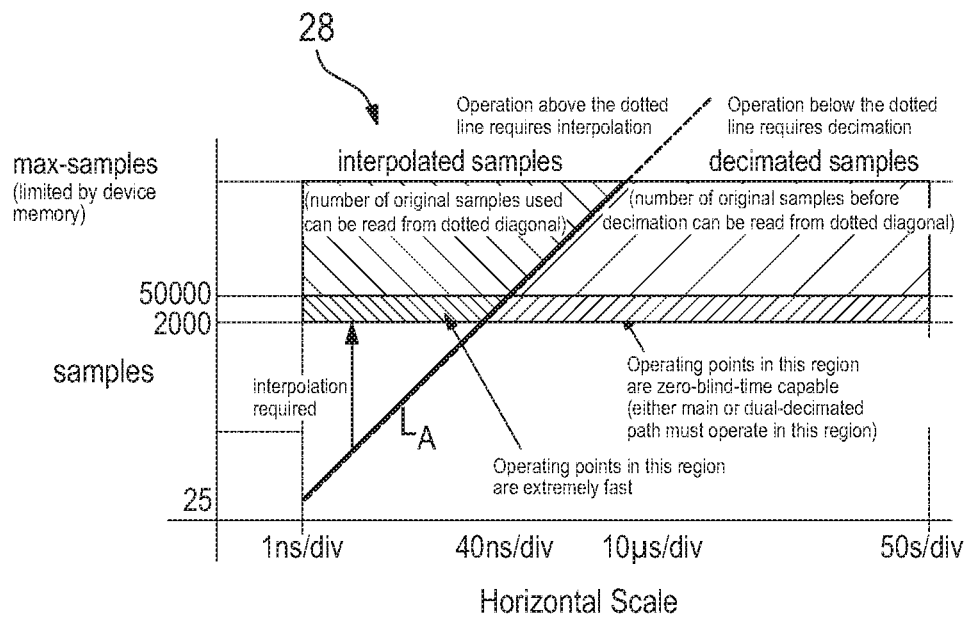
FIG. 10 shows an oscilloscope user interface in a ninth state according to the present disclosure.
Figure 11:
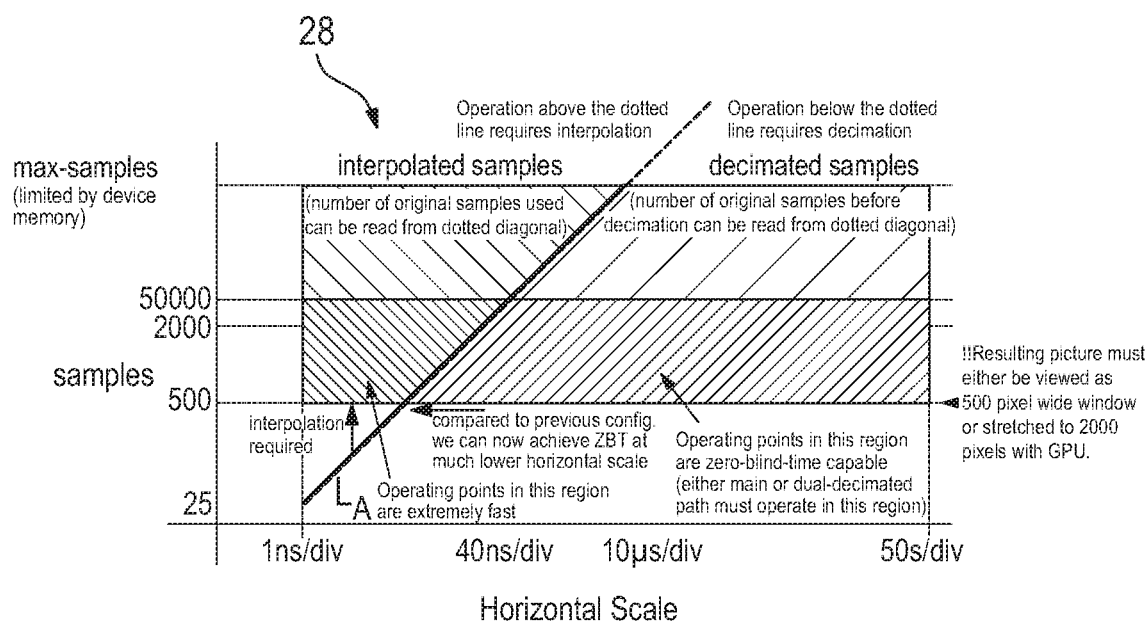
FIG. 11 shows an oscilloscope user interface in a tenth state according to the present disclosure.

In FIGS. 10 and 11, the graphical user interface 28 illustrates zero-blind-time limit. Thus, areas with oscilloscope operating points being zero-blind-time capable are shown.

Comparing FIGS. 10 and 11 reveal that reducing the number of pixel columns, for instance either reduce the width of the display window or sacrifice the resolution, the range of vertical scales which are zero-blind capable can be increased.

Figure 12:
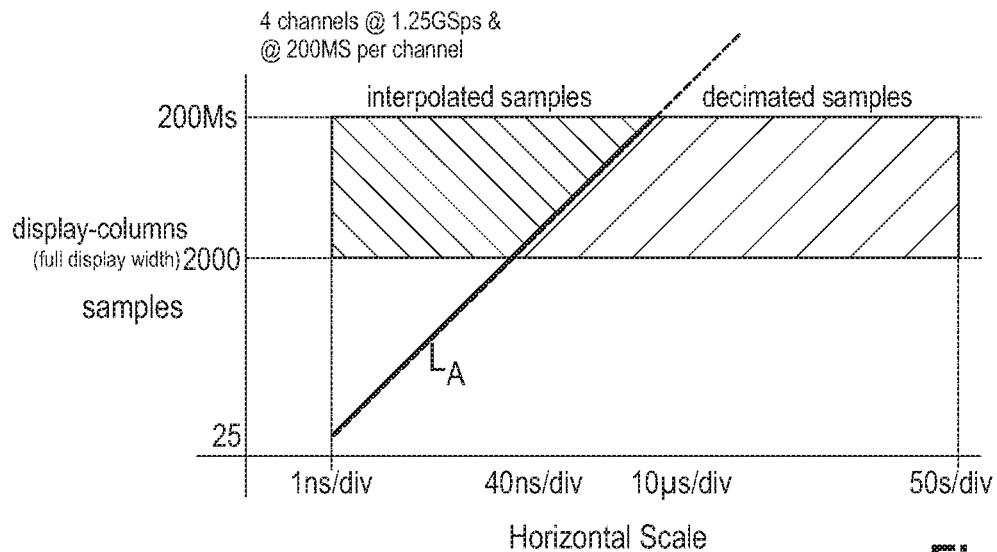
FIG. 12 shows an oscilloscope user interface in an eleventh state according to the present disclosure.
Figure 13:
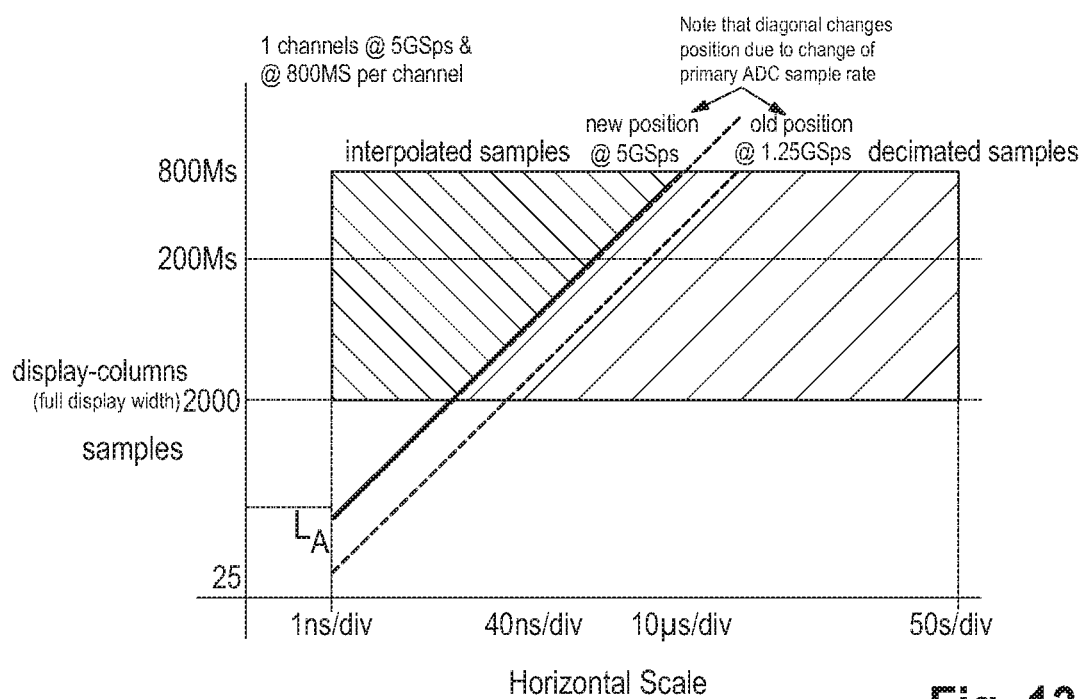
FIG. 13 shows an oscilloscope user interface in a twelfth state according to the present disclosure.

In FIGS. 12 and 13, the graphical user interface 28 illustrates a channel operating mode limit based upon a number of active oscilloscope channels. It is illustrated that each channel is sampled with a certain sample rate, e.g., 1.25 GSps, and with a maximum memory depth, e.g., 200 MS.

Changing the number of active oscilloscope channels yields an increase of the certain sample rate as well as the maximum memory depth per channel.

Figure 14:
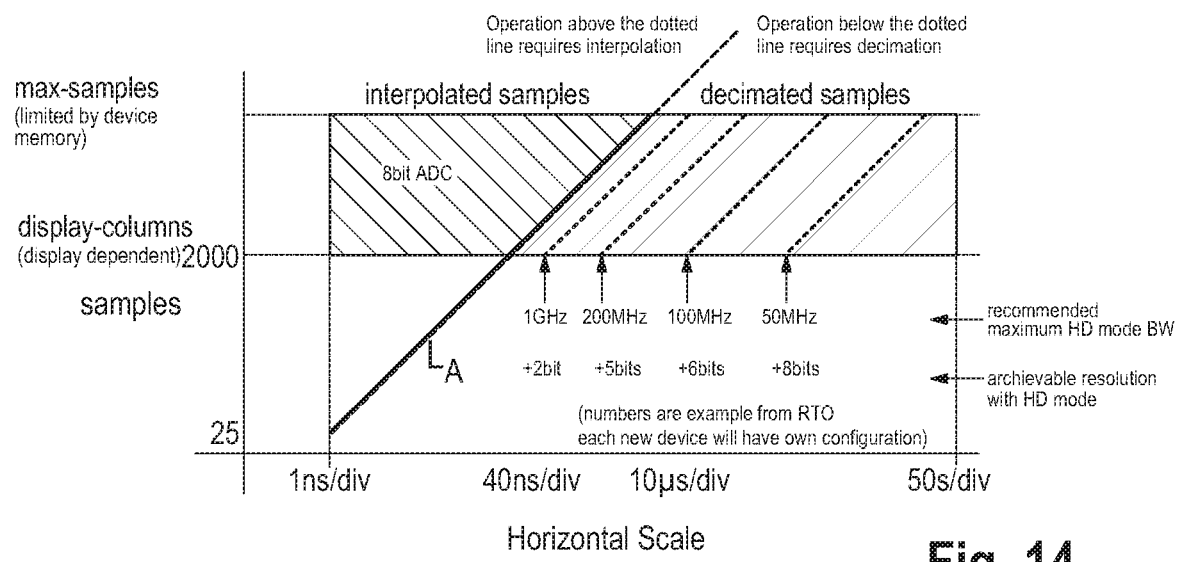
FIG. 14 shows an oscilloscope user interface in a thirteenth state according to the present disclosure.

In FIG. 14, the graphical user interface 28 illustrates a guiding or rather recommendation how to adapt the respective settings. In some embodiments, useful settings for a high definition mode are illustrated as well as the achievable results when following the recommendations.

Generally, the graphical user interface 28 may also illustrate a preview that can be displayed next to the oscilloscope operating point determined to provide an instantaneous preview based on the respective oscilloscope operating point.

Therefore, the operator is enabled to understand which settings are allowed and how to adapt the input (value) to obtain an allowable oscilloscope operating point or rather a valid one.

The respective oscilloscope operating points may be viewed on the graphical user interface 28 or rather directly adapted/selected by interacting with the touch-sensitive oscilloscope display 16 on which the graphical user interface 28 is displayed.

It should be understood that the term processor or computer can include any processing structure, including but is not limited to a microprocessor, a central processing unit (CPU), a digital signal processor (DSP), an application-specific integrated circuit (ASIC), a field-programmable gate array (FPGA), a system on a chip (SoC), or the like, or any combinations thereof. It should be also understood that any of the block diagrams, flowchart illustrations, and related descriptions, or parts thereof, respectively, may be implemented in part by computer program instructions, e.g., as logical steps or operations executing on the processor 20. These computer program instructions may be loaded onto a computer, such as a special purpose computer or other programmable data processing apparatus, such as the oscilloscope 12, to produce a specifically-configured machine, such that the instructions which execute on the computer or other programmable data processing apparatus implement the functions specified in the illustrated block or blocks, the methods steps described herein in any combination, etc.

In an embodiment, the processor 20 is associated with a memory storing logic modules and/or instructions for carrying out the function(s) of these components and/or any of its sub-units, either separately or in any combination. In an embodiment, the processor 20 includes or is in the form of one or more ASICs having a plurality of predefined logic components for implementing the functionality described herein. In an embodiment, the processor 20 includes or is in the form of one or more FPGA having a plurality of programmable logic components for implementing the functionality described herein. In an embodiment, the processor 20 includes or is in the form of hardware circuit implementations (e.g., implementations in analog circuitry, implementations in digital circuitry, and the like, and combinations thereof) for implementing the functionality described herein. In an embodiment, the processor 20 includes or is in the form of combinations of circuits and computer program products having software or firmware instructions stored on one or more computer readable memories that work together to cause a device to perform one or more methodologies or technologies described herein.

The present application may also reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property of privilege is claimed are defined as follows:

1. A method for operating an oscilloscope, with the following steps:
    detecting a waveform axis scale input value;
    detecting a record length input value; and
    determining an oscilloscope operating point relative to at least one predetermined operating mode limit,
    wherein a preview is displayed next to the oscilloscope operating point determined to provide an instantaneous preview based on the respective oscilloscope operating point,
    wherein the operating mode limit comprises at least one selected from the group consisting of a decode mode limit based upon available processing power for bus decoding a measured bus signal, a zoom window limit based upon a zoom factor, a visualization limit based upon a zoom factor, a zero-blind-time limit based upon operating points being zero-blind-time capable, and combinations thereof.

2. The method according to claim 1, wherein the waveform axis scale input value is a horizontal scale input value.

3. The method according to claim 1, wherein at least one of the waveform axis scale input value and the record length input value is set manually by an operator of the oscilloscope.

4. The method according to claim 1, wherein at least one of the waveform axis scale input value and the record length input value is set by at least one of using a knob, using a dial, using a button, using a remote control device and touching a touch-sensitive display.

5. The method according to claim 1, wherein the determination of the oscilloscope operating point is based upon at least one of the waveform axis scale input value and the record length input value.

6. The method according to claim 1, wherein the operating mode limit is predetermined based upon at least one of an original analog to digital converter sample rate, a rate change due to decimation or interpolation and a number of divisions.

7. The method according to claim 1, wherein at least one of the oscilloscope operating point and the operating mode limit is processed by a graphic processor for displaying at an oscilloscope display.

8. The method according to claim 1, wherein the operating mode limit comprises an interpolation mode versus decimation mode limit.

9. The method according to claim 1, wherein the operating mode limit comprises a display column value limit based upon a number of columns of the oscilloscope display.

10. The method according to claim 1, wherein the operating mode limit comprises a channel operating mode limit based upon a number of active oscilloscope channels.

11. The method according to claim 1, wherein the operating mode limit comprises a spectrum analysis limit based upon at least one of a span or a resolution bandwidth.

12. The method according to claim 1, wherein a recommendation is displayed how to adapt at least one of a setting of the oscilloscope, the waveform axis scale input value or the record length input value.

13. A method for operating an oscilloscope, with the following steps:
- receiving an input of an operator with regard to at least one of a waveform axis scale input value and a record length input value,
- processing the input of the operator to determine an allowable operating range based upon the input of the operator, and
- displaying the allowable operating range determined on an oscilloscope display,
- wherein the allowable operating range comprises at least one predetermined operating mode limit, and
- wherein the operating mode limit comprises at least one selected from the group consisting of a decode mode limit based upon available processing power for bus decoding a measured bus signal, a zoom window limit based upon a zoom factor, a visualization limit based upon a zoom factor, a zero-blind-time limit based upon operating points being zero-blind-time capable, and combinations thereof.

14. The method according to claim 13, wherein the allowable operating range displayed relates to at least one of a range of allowed settings and allowable oscilloscope operating points.

15. The method according to claim 13, wherein the allowable operating range is displayed on an interactive display enabling the operator to adapt its input instantaneously.

16. An oscilloscope comprising a housing;

a processor housed in the housing; and an oscilloscope display assigned to the housing, wherein the processor is connected with the oscilloscope display, the processor being configured to process an operator input with regard to at least one of a waveform axis scale input value or a record length input value, the processor being further configured to determine an oscilloscope operating point relative to at least one predetermined operating mode limit, wherein the operating mode limit comprises at least one selected from the group consisting of a decode mode limit based upon available processing power for bus decoding a measured bus signal, a zoom window limit based upon a zoom factor, a visualization limit based upon a zoom factor, a zero-blind-time limit based upon operating points being zero-blind-time capable, and combinations thereof.

* * * * *